(12) United States Patent
Sato et al.

(10) Patent No.: US 6,468,663 B1
(45) Date of Patent: Oct. 22, 2002

(54) SEMICONDUCTOR SUBSTRATE AND PROCESS FOR PRODUCING THE SAME

(75) Inventors: Nobuhiko Sato, Yokohama; Takao Yonehara, Atsugi, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 09/690,982

(22) Filed: Oct. 18, 2000

Related U.S. Application Data

(62) Division of application No. 08/010,297, filed on Jan. 28, 1993, now Pat. No. 6,309,945.

(30) Foreign Application Priority Data

Jan. 31, 1992 (JP) .............................................. 4-046302

(51) Int. Cl.⁷ ............................. B32B 13/04; B32B 9/04
(52) U.S. Cl. ....................... 428/446; 428/448; 428/447; 428/688; 117/950
(58) Field of Search .................................. 428/446, 448, 428/447, 688; 117/950

(56) References Cited

U.S. PATENT DOCUMENTS

| | | |
|---|---|---|
| 3,929,529 A | 12/1975 | Poponiak .............. 148/DIG. 15 |
| 5,094,697 A | 3/1992 | Takabayashi et al. ....... 136/249 |
| 5,277,748 A | 1/1994 | Sakaguchi et al. ............ 437/71 |
| 5,371,037 A | 12/1994 | Yonehara ..................... 437/86 |

FOREIGN PATENT DOCUMENTS

| | | |
|---|---|---|
| EP | 469630 | 2/1992 |
| EP | 515181 | 11/1992 |
| JP | 78-045675 | 12/1978 |

OTHER PUBLICATIONS le;.3qMaterials Letters; L. Vescan et al.; "Low–Pressure Vapor–Phase Epitaxy of Silicon on Porous Silicon"; Sep. 1988, vol. 7, pp. 94–98.

Mattertials Letters; R. Herino et al.; "Microstructure of Porous Silicon and its Evolution with Temperature"; Sep. 1984, vol. 2, pp. 519–523.

Patent Abstracts of Japan, vol. 004, No. 044 (E–005), Apr. 5, 1980 & JP 55 016464 A (NEC Corp), Feb. 1980.

Takoi and Itol; "porous silicon layers and its oxide for the silicon–on–insulator structure", J. of Applied Physics, pp. 222–225, vol. 60, No. 1, Jul. 1, 1986.

"Pore Size Distribution in Porous Silicon Studies by Adsorption Isotherms" by G. Bomchil et al.; Journal of the electrochemical Society, vol. 130, No. 7, Jul. 1983, jpgs. 1611—1614.

"Complete dielectric isolation by highly selective and self–stopping formation of oxidized porous silicon" by R.P. Holmstrom et al.; Applied Physics Letters, Feb. 15, 1983 pp. 386–388.

"Electrolytic Shaping of Germanium and Silicon" by A. Uiilir, Jr.; The Bell System Technical Journal; vol. XXXV 1956; pp. 332–347, No Month.

"A New Dielectric Isolation Method Using Porous Silicon" by Kazuo Imai; Solid–State Electronics. An International Journal, 1981; pp. 159–164, No Month.

"Formation Mechanism of Porous Silicon Layer by Anodization in HS Solution" by Takashi Unagami; Journal of the Electrochemical Society; vol. 127, No. 2; Feb. 1980; pp. 476–483.

*Primary Examiner*—Deborah Jones
*Assistant Examiner*—A B Sperty
(74) *Attorney, Agent, or Firm*—Fitzpatrick, Cella, Harper & Scinto

(57) ABSTRACT

A process for producing a semiconductor substrate comprises the steps of forming a porous layer in a first substrate comprising monocrystalline silicon; forming a protective film on a side wall of the pores of the porous layer; forming a nonporous monocrystalline silicon layer on the porous layer; bonding the surface of the nonporous monocrystalline silicon layer onto a second substrate with interposition of an insulating layer; and etching off selectively the porous layer by use of a chemical etching solution.

7 Claims, 4 Drawing Sheets

SEMICONDUCTOR SUBSTRATE AND PROCESS FOR PRODUCING THE SAME

This application is a division of Application Ser. No. 08/010,297, filed Jan. 28, 1993 now U.S. Pat. No. 6,309,945.

BACKGROUND OF THE INVENTION

1. Field of the Invention

The present invention relates to a semiconductor substrate, and a process for producing the semiconductor substrate. More particularly, the present invention relates to a semiconductor substrate suitable for dielectric isolation, and electronic devices and integrated circuits formed in a monocrystalline semiconductor layer on an insulator, and to a process for producing such a semiconductor substrate.

2. Related Background Art

Formation of monocrystalline Si semiconductor layer on an insulator is well known as silicon-on-insulator technique (SOI). Many investigations have been made thereon since the devices made by the SOI technique have many advantages which are not achievable with a bulk Si substrate for preparing usual Si integrated circuits. The advantages brought about by the SOI technique are as below:
1. Ease of dielectric separation, and practicability of high integration,
2. High resistance against radioactive rays,
3. Low floating capacity, and practicability of high speed operation,
4. Practicability of omission of a welling step,
5. Practicability of prevention of latching-up,
6. Practicability of thin film formation for complete depletion type field effect transistor, and so forth.

In order to realize the aforementioned advantages in device characteristics, investigations have been made on the methods of forming the SOI structure for the last few decades. The results of the investigations are collected in the literature, for example: Special Issue: "Single-crystal silicon on non-single-crystal insulators"; edited by G. W. Cullen, Journal of Crystal Growth, Vol. 63, No. 3, pp. 429–590 (1983).

Formerly, the SOS technique (silicon-on-sapphire) is known which forms heteroepitaxial Si on monocrystalline sapphire substrate by CVD (chemical vapor deposition). This technique, although successful as completed SOI technique, is not widely applied because of many crystal defects caused by insufficient matching of the lattice at the interface between the Si layer and the underlying sapphire substrate, migration of aluminum from the sapphire substrate to the Si layer, and, above all, the high cost of the substrate and difficulty in enlarging the area thereof.

In recent years, the SOI structure without use of the sapphire substrate has been progressing toward realization. This attempt is made in two methods:
(1) methods comprising steps of oxidizing a surface of an monocrystalline Si substrate, forming an aperture in the oxidized layer to uncover partially the Si substrate, growing Si epitaxially in a lateral direction using the uncovered Si as the seed to form an monocrystalline Si layer on the $SiO_2$ (deposition of Si on $SiO_2$), and
(2) methods of forming $SiO_2$ under a monocrystalline Si substrate by use of the monocrystalline Si substrate itself as the active layer (no deposition of Si layer).

The means for practicing the methods (1) above include direct epitaxial growth of monocrystalline Si layer in a lateral direction by CVD; deposition of amorphous Si and subsequent epitaxial growth in solid in a lateral direction by heat treatment; growth of amorphous or polycrystalline Si into monocrystalline layer by melting-recrystallization by focusing thereon an energy beam such as electron beam and laser light; and zone melting recrystallization by a long heater. These methods have both advantages and disadvantages, still involving problems in controllability, productivity, uniformity, and quality of the products. Therefore, none of these methods has been practiced industrially.

For example, the CVD process requires sacrificial oxidation. The solid growth results in low crystallinity. The beam annealing process involves problems in treating time, control of superposition of the beam and focus adjustment. Among the above methods, zone melting recrystallization is most highly developed, and has been employed for experimental production of relatively large integrated circuits. This method, however, still causes crystal defects such as subgrain boundary, etc., and does not give a minority carrier device.

The methods (2) above, which does not use the Si substrate as the seeds for epitaxial growth, are practiced in the three ways below:

1. A surface of a monocrystalline Si substrate is etched anisotropically to form V-shaped grooves on the surface. An oxide film is formed thereon. On the oxide film, a polycrystalline Si layer is deposited in a thickness that is nearly the same as the Si substrate. Then the Si substrate is abraded at the backside to form dielectrically separated monocrystalline Si regions surrounded by the V-shaped grooves on the thick polycrystalline Si layer. Although this technique gives satisfactory crystallinity, it involves problems in control and productivity in the process of depositing polycrystalline Si in a thickness of as much as several hundred $\mu$m and in the process of abrading the monocrystalline Si substrate from the backside to leave only the separated active Si layer.

2. An $SiO_2$ layer is formed on a monocrystalline Si layer by oxygen ion implantation. This method is called SIMOX (separation by ion implanted oxygen). This process exhibits excellent coherency with the Si process, and is the most highly developed technique at the moment. However, the process requires implantation of oxygen ions as much as $10^{18}$ ions/cm$^2$ to form the $SiO_2$ layer, and the implantation takes long time, so that the productivity is not high, and the wafer cost is high. Furthermore, the product has many remaining crystal defects, and does not have satisfactory quality for industrial production of minority carrier devices.

3. The SOI structure is formed by dielectric separation by oxidation of porous Si. In this method, on a surface of a P-type monocrystalline Si substrate, an N-type Si layer is formed in an island shape by proton ion implantation (Imai, et al.: J. Crystal Growth, vol. 63, 547, (1983)), or by epitaxial growth and patterning, then the P-type Si substrate only is made porous by anodization in an HF solution so as to surround the island-shaped Si regions, and the N-type Si islands are separated dielectrically by accelerated oxidation. This method has disadvantage that the freedom in device design is frequently restricted since the Si region to be separated has to be decided prior to the device production process.

For example, Japanese Patent Publication No. 53-45675 discloses a process for forming SOI in which a monocrystalline silicon layer is grown on a porous layer or a porous insulating layer. In this process, a porous layer is heat-treated in an oxidizing atmosphere to give the layer of high resistance, thereby obtaining an SOI structure. This process, although proposed more than 10 years ago, has not been practically employed. This is because the porous material is thermally instable and nonuniform in structure. In the porous material, extremely fine pores are formed in monocrystalline silicon. The thickness of monocrystalline silicon layer remaining between the pores can be made to be in the range of as small as from several nm to several tens of nm. Such porous silicon is oxidizable in a much larger reaction velocity than normal monocrystalline silicon. By utilizing this phenomenon, the SOI can be prepared by selectively oxidizing the porous lower portion of the monocrystal layer. This method, however, involves the disadvantage that satisfactory insulating layer cannot readily be prepared owing to residual silicon in the insulating layer and variation of the thickness of the oxide layer which are caused by nonuniformity in size of the silicon regions remaining in the porous layer. This method involves a further disadvantage that the porous material comes to have coarser structure during the heat treatment at the high temperature required for oxidation, whereby the rate of oxidation falls. Furthermore, if the porous silicon or a high-resistance porous material remains on the substrate, it induces denaturation such as structural change or coarsening of the porous structure in heat treatment for formation of an element on the substrate, which tends to cause warpage or distortion of the substrate.

On the other hand, a light-transmissive substrate typified by glass allows Si to grow only into an amorphous or polycrystalline layer under the influence of the disorderness of the crystal structure thereof, and is unsuitable for production of devices of high performance. Simple deposition of Si on such a substrate will not give excellent monocrystal layer because of the amorphous structure of the substrate. The light-transmissive substrate is important in constructing a contact sensor as a light-receiving element, a projection type liquid crystal image displaying apparatus, and the like. In order to provide a sensor or a display apparatus with image elements (picture elements) in higher density, higher resolution, and higher fineness, extremely high performance of the driving element is required. Therefore, the element on a light-transmissive substrate have to be made from monocrystal layer having excellent crystallinity.

In other words, amorphous Si or polycrystalline Si will not generally give a driving element which exhibits the satisfactory performance required or to be required in the future because of many defects in the crystal structure.

On a light-transmissive substrate, however, none of the above methods for a monocrystalline Si substrate is suitable for forming an excellent monocrystal layer.

SUMMARY OF THE INVENTION

It is, therefore, an object of the present invention to provides a semiconductor substrate which is free from the aforementioned problems and satisfies the above requirements, and to provide a process for production thereof.

Another object of the present invention is to provide a process for producing a semiconductor substrate of SOI structure which prevents strong coarsening of the porous structure at the high temperature in the epitaxial growth and the substrate bonding operation.

Another object of the present invention is to provide a semiconductor substrate which has the advantage of the conventional SOI structure and is applicable to various high-performance electronic devices, and to provide a process for production thereof.

Still another object of the present invention is to provide a semiconductor substrate which is useful in place of expensive SOS and SIMOX in production of large scale integrated circuits, and to a process for production thereof.

Yet another object of the present invention is to provide a process for producing a semiconductor substrate having, on an insulating layer, an Si layer of crystallinity as high as monocrystalline wafer with prominence in productivity, uniformity, controllability, and cost.

Again, another object of the present invention is to provide a process for producing a semiconductor substrate having, on a transparent (light-transmissive) base plate, an Si layer of crystallinity as high as monocrystalline wafer with prominence in productivity, uniformity, controllability, and cost.

DESCRIPTION OF THE PREFERRED EMBODIMENT

A process for producing a semiconductor substrate of the present invention comprises the steps of forming a porous layer in a first substrate comprising monocrystalline silicon; forming a protective film on a side wall of the pores of the porous layer; forming a nonporous monocrystalline silicon layer on the porous layer; bonding the surface of the nonporous monocrystalline silicon layer onto a second substrate with interposition of an insulating layer; and etching off selectively the porous layer by use of a chemical etching solution.

In the present invention, forming a protective film on the side wall of the pores of the porous silicon layer prevents coarse structure formation in the porous silicon layer, and maintains the selectivity of the etching. Therefore, heat treatment at a high temperature is practicable in order to form nonporous monocrystalline silicon with high crystallinity or to form strong bonding. Thereby, a monocrystalline Si layer with extremely few defects or weak bonding points is obtainable on a base member which has an insulating layer on the surface or on a light-transmissive base member.

The present invention is described in more detail by reference to examples of the embodiment.

Embodiment 1

A method is explained in which an Si substrate is made porous and thereon a monocrystal layer is allowed to grow epitaxially.

Figure 1A:
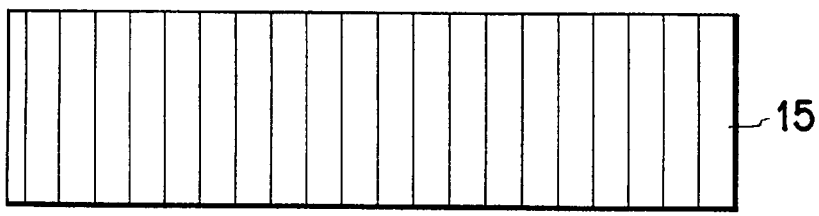
FIGS. 1A to 1E are schematic views for explaining an example of the process of the present invention.
Figure 4A:
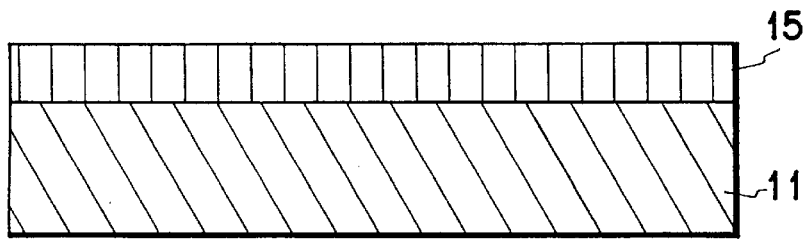
FIGS. 4A to 4E are schematic views for explaining another example of the process of the present invention.

A monocrystalline Si substrate 11 is provided and made porous entirely as shown in FIG. 1A or partially as shown in FIG. 4A, thereby forming a porous layer 15.

The Si substrate is porousified by anodization in an HF solution. While the density of monocrystalline Si is 2.33 g/cm$^3$, the density of porous monocrystalline Si layer 15 can be varied from 0.6 to 1.1 g/cm$^3$ by varying the concentration of the HF solution in the range of from 20 to 50%. The porous monocrystalline Si layer 15 tends to be formed readily in a P-type substrate by the reasons below. The pores formed have an average diameter of from about 50 Å to about 600 Å according to observation by transmission electron microscopy.

The porous monocrystalline Si was found in the course of study on electropolishing of semiconductors in the year 1956 by A. Uhlir et al. (A. Uhlir, et al.: Bell Syst. Tech. J., vol. 35, p. 333 (1956)). The dissolving reaction of Si in anodization was studied by Unagami, who reported that positive holes are required for anodic reaction of Si in an HF solution and the reaction proceeds according to the formulas below (T. Unagami: J. Electrochem. Soc., vol. 127, p. 476 (1980):

$$Si+2HF+(2-n)e^+ \rightarrow SiF_2+2H^+ +ne^-$$

$$SiF_2+2HF \rightarrow SiF_4+H_2$$

$$SiF_4+2HF \rightarrow H_2SiF_6$$

or otherwise, $$Si+4HF+(4-\lambda)e^+ \rightarrow SiF_4+4H^+ +\lambda e^-$$

$$SiF_4+2HF \rightarrow H_2SiF_6$$

where $e^+$ and $e^-$ represent respectively a positive hole and an electron; n and $\lambda$ represent respectively the number of the positive holes required for dissolving one atom of monocrystalline Si, and it was also reported that porous silicon is formed if $n>2$, or $\lambda>4$.

Accordingly, a P-type Si having positive holes is more readily made porous. This selectivity in porous structure formation has already been actually proved by Nagano et al. (Nagano, Nakajima, Yasuno, Ohnaka, and Kajihara: Densi Tsushin Gakkai Gijutsu Kenkyu Hokoku (Technical Bulletin of Electronic Communication Society) vol. 79, SSD 79–9549 (1979)) and K. Imai: Solid State Electronics, vol. 24, p. 159 (1981)). Thus, P-type silicon having positive holes can be selectively porousified.

On the other hand, it was also reported that high-concentration N-type silicon can also be made porous (R. P. Holmstorm, I.J.Y. Chi: Appl. Phys. Lett. vol. 42, p. 386 (1983)). Therefore it is important to select the substrate capable of being made porous, regardless of whether the structure is of P-type or of N-type.

Figure 1B:
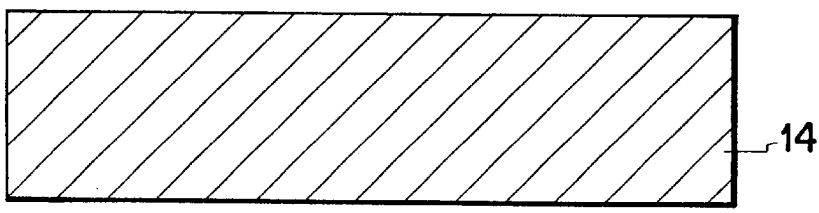
Figure 4B:
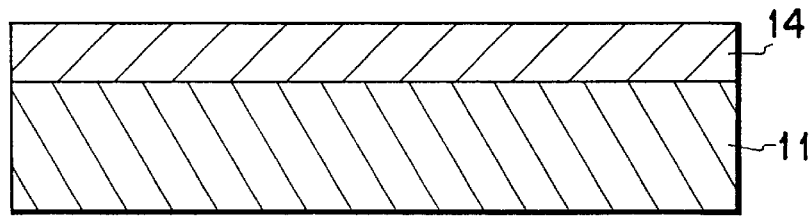

After the monocrystalline silicon substrate is porousified, a protective film is formed on the side wall of the pores of the porous layer as shown in FIG. 1B or FIG. 4B.

The protective film is made of a material including silicon oxide, silicon nitride, etc. The protection film is formed by deposition or adhesion of another film, or by denaturation of the silicon itself by chemical reaction. Specifically the protection film is formed, for example, by (1) oxidation treatment such as thermal oxidation, oxidation by oxygen plasma, and immersion in an oxidizing solution; (2) nitridation treatment such as heat treatment in a nitrogen atmosphere or an ammonia atmosphere, and nitridation by ammonia plasma; and the like methods. However, the protective film is not limited thereto, but any protective film may be used which allows the epitaxial growth and the bonding in the subsequent steps.

The oxidation or the nitridation proceeds from the wall of the pores to the interior thereof in the porous material. It is important that the oxidation is stopped before all of the porous layer is oxidized and silicon region is lost, and that the monocrystallinity of silicon is retained. The monocrystallinity of silicon is confirmed by X-ray diffraction, Rutherford backscattering spectroscopy, etc. The thickness of the protective film is decided depending on the porous matter, and preferably in the range of from 1 nm to 40 nm, more preferably 2 nm to 30 nm. The formation of the protective film is desirably conducted at a low temperature where structural change or coarsening of the porous matter does not occur. The temperature is preferably in the range of from 100° C. to 900° C., more preferably from 200° C. to 700° C. In particular, in the thermal oxidation, the temperature is preferably not lower than 400° C.

In the aforementioned oxidation in an oxidizing solution, the oxidizing solution includes aqueous hydrogen peroxide solution, sulfuric acid solution, and nitric acid solution, and mixtures of aqueous hydrogen peroxide with an acid such as sulfuric acid, nitric acid, and hydrochloric acid, but is not limited thereto.

Figure 1C:
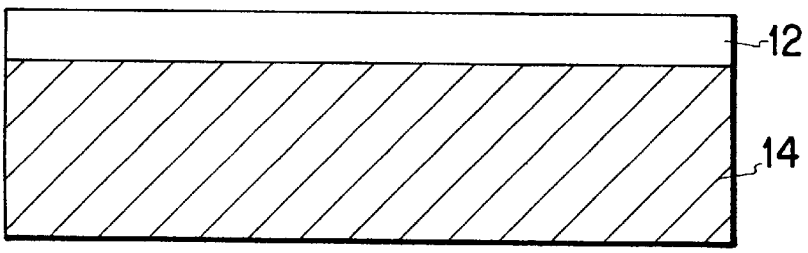
Figure 4C:
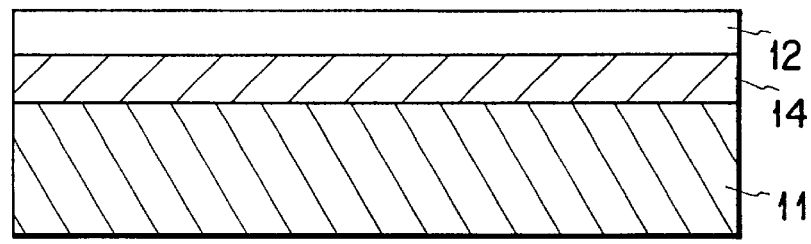

Subsequently, on the porous surface of the substrate, a thin monocrystalline layer 12 is formed as shown in FIG. 1C or FIG. 4C by any epitaxial growth method. If necessary, prior to the epitaxial growth, the oxide layer on the porousified substrate surface of the oxide layers formed by the oxidation treatment is removed by etching with aqueous hydrofluoric acid or other procedure.

In the porous Si layer, pores of about 600 Å in average diameter are formed according to observation with transmission electron microscopy. Although the density thereof is half or less than the density of monocrystalline Si, the monocrystallinity is retained, and epitaxial growth of monocrystalline Si is practicable on the surface. However, rearrangement of the internal pores occurs in epitaxial growth at a temperature above 1000° C., which impairs the characteristics of enhanced etching. Therefore, the epitaxial growth of an Si layer is preferably conducted by a low temperature growth process such as molecular beam epitaxial growth, plasma CVD, thermal CVD, photo-assisted CVD, bias sputtering, liquid phase growth, etc.

In the epitaxial growth on the porous Si, the strain caused in the heteroepitaxial growth can be relaxed, and development of defects can be prevented by the structural properties of the porous Si.

The porous layer has a density of half or less than the density of nonporous layer because of the large amount of void in the interior thereof, and has greater surface area for the volume. Consequently, the rate of the chemical etching is significantly increased than that of a normal monocrystalline layer.

The known methods for the etching of porous Si include:
(1) etching of porous Si with aqueous NaOH solution (G. Bonchil, R. Herino, K. Barla and J. C. Pfister: J. Electrochem. Soc., vol. 130, no. 7, p. 1611 (1983)), and
(2) etching of porous Si with an etching solution capable of etching monocrystalline Si.

In the above method (2), a hydrofluoric nitric acid type etching solution is used normally. With this etching solution, the etching proceeds with oxidation of Si by nitric acid to form $SiO_2$ and subsequent etching of the resulting $SiO_2$ by hydrofluoric acid as shown below:

$$Si+2O \rightarrow SiO_2$$

$$SiO_2+4HF \rightarrow SiF_4+2H_2O$$

The known methods for etching crystalline Si include etching with an etching solution of ethylene diamine type, KOH type, hydrazine type or the like as well as the above hydrofluoric nitric acid type etching solution.

The selective etching of porous Si, which is particularly effective and important in the present invention, employs hydrofluoric acid or a buffered hydrofluoric acid which does not have etching action for crystalline Si. In this etching, an aqueous hydrogen peroxide solution may be used additionally as an oxidizing agent. The reaction rate can be controlled by changing the ratio of addition of the hydrogen peroxide. An alcohol may be added which serves as a surface active agent to remove instantaneously the bubbles of the gaseous reaction product from the etching surface, and enables selective etching of porous Si uniformly and efficiently.

Figure 2:
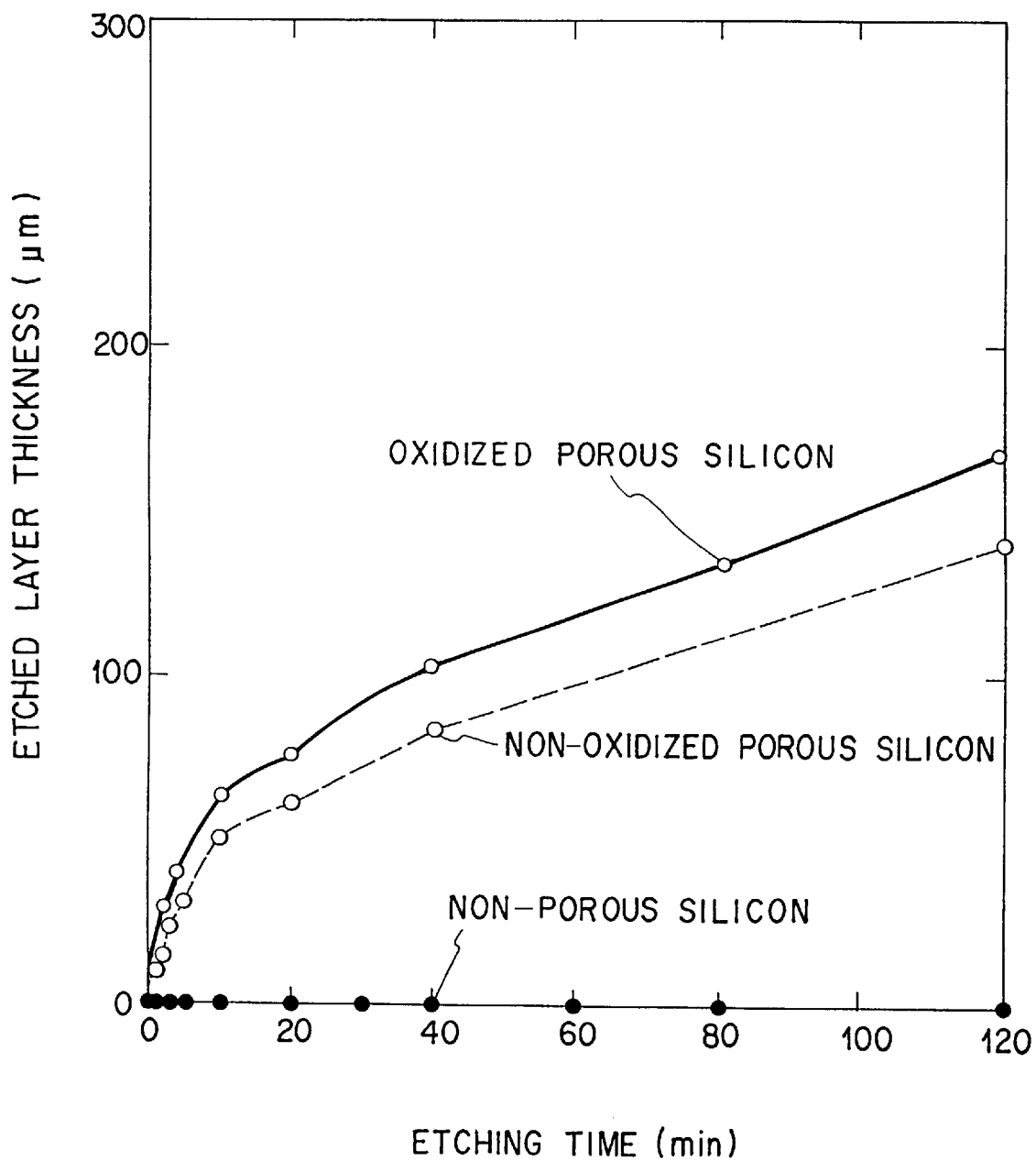
FIG. 2 is a graph showing the etching characteristics of porous silicon and nonporous silicon.

Preliminary oxidation of the porous silicon accelerates the etching of the porous silicon layer by hydrofluoric acid. Further, since the silicon wall of the porous layer is made thin, the etching rate is increased practiclly by 20%, thereby raising the selectivity of etching of the porous monocrystalline silicon layer relative to the nonporous monocrystalline silicon layer. FIG. 2 shows the etching characteristics of the porous silicon and the nonporous silicon. In FIG. 2, the solid line shows the progress of the etching of oxidized porous silicon, and the broken line shows that of unoxidized porous silicon.

The porous silicon, when thermally treated at a high temperature, is subjected to rearrangement and especially coarsening of the pores, resulting in decrease of the etching rate. However, the oxidation of the porous silicon suppresses the coarsening of the pores in the porous layer and prevents the decrease of the etching rate of the porous layer even when high temperature treatment is conducted later for high temperature growth to form a nonporous monocrystalline silicon layer with high crystallinity and for strengthening the bonding to the substrate. In particular, when a hydrofluoric type etching solution is employed, the oxidation of the porous silicon accelerates the etching of the porous layer by 20% in comparison with unoxidized porous silicon even after the heat treatment.

Figure 1D:
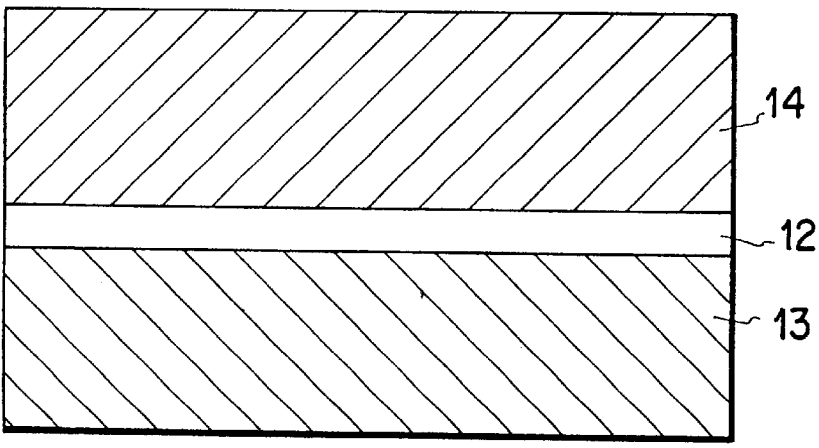
Figure 4D:
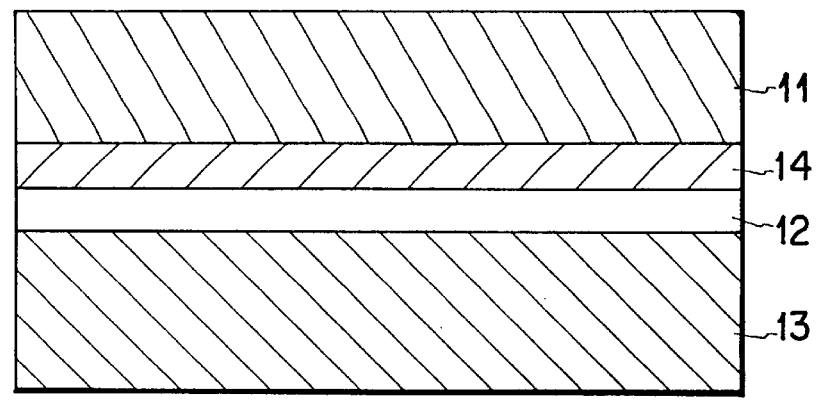

Subsequently, as shown in FIG. 1D and FIG. 4D, the surface of the monocrystalline Si layer 12 on the porous Si substrate 14 is bonded to a surface of a second substrate 13 composed of a base material such as a silicon base and an insulating layer formed thereon, or a light-transmissive substrate 13.

Prior to the bonding, an oxide layer may be formed on the surface of the monocrystalline layer 12 on the porous Si to form beforehand an interface between the monocrystalline silicon layer and the insulating layer. The oxide layer plays an important role in preparation of a device. That is, as to the interfacial level caused by an interface with an underlying base of an Si active layer, the level of the interface with an underlying base formed by oxidation of a monocrystalline silicon layer can be made smaller than that of a bonding interface especially with glass. In other words, by keeping a bonding interface apart from an active layer, the energy level which may be caused in the bonded interface is kept apart, whereby the performance of the electronic device is remarkably improved. The monocrystalline Si layer on porous Si, on the surface of which an oxide layer is formed, may be bonded to a desired substrate such as an Si substrate.

Thereafter, the porous Si substrate 14 is entirely removed by chemical etching to obtain a substrate which is constituted of a base plate having an insulating layer on the surface thereof or a light-transmissive base plate and a thin-layered monocrystalline silicon layer remaining thereon. Prior to the etching, an etching prevention film may be formed on the portion other than the porous silicon portion. For example, the two substrates bonded together is entirely coated by deposition of $Si_3N_4$, and the portion of the $Si_3N_4$ on the porous silicon surface is removed before the etching. As the etching prevention film, Apiezon Wax may be used in place of the $Si_3N_4$.

In the case where the Si substrate is partially made porous as shown in FIG. 4D, the nonporous part of the substrate is removed to uncover the porous layer by grinding or abrasion, or etching with a mixture of hydrofluoric acid, nitric acid and acetic acid or other etching solution as usually employed in Si wafer production.

Figure 1E:
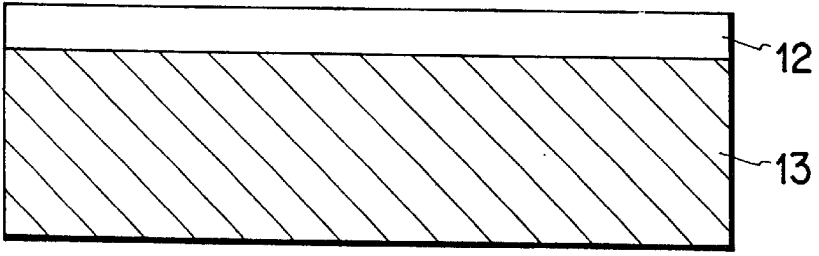
Figure 4E:
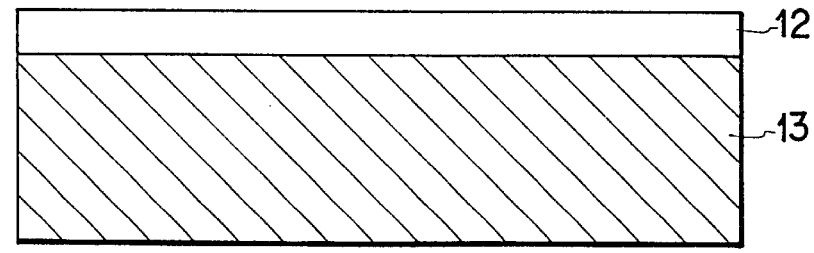

FIG. 1E and FIG. 4E illustrate respectively a semiconductor substrate obtained according to the present invention, in which a monocrystalline Si layer 12 having crystallinity similar to a silicon wafer is formed in a shape of uniform flat thin layer in a large area on the substrate 13 having an insulating layer on the surface or a light-transmissive substrate 13 over the entire wafer.

The resulting semiconductor substrate can be used suitably for production of dielectrically isolated electronic elements.

Embodiment 2

Another example of the embodiment of the process for producing a semiconductor substrate of the present invention is described in detail in reference to the drawings.

FIGS. 3A to 3E illustrate schematically the steps of producing a semiconductor substrate of the present invention by cross-sectional views.

Figure 3A:
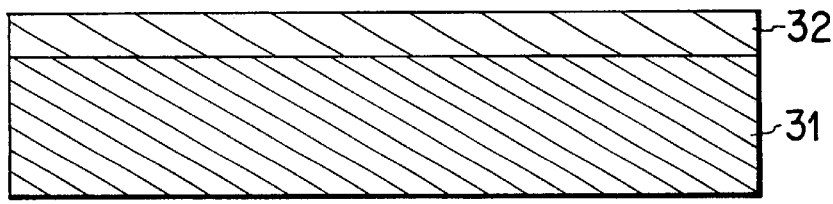
FIGS. 3A to 3E are schematic views for explaining another example of the process of the present invention.

First, as shown in FIG. 3A, a low-impurity-density layer 32 is formed epitaxially by a thin film growth method, or otherwise a N-type monocrystalline layer 32 is formed by proton ion implantation, on the surface of a P-type monocrystalline Si substrate 31.

Figure 3B:
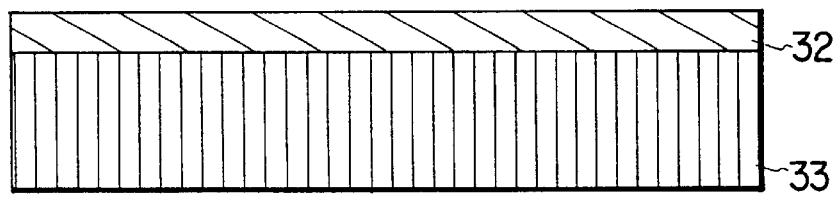
Figure 3C:
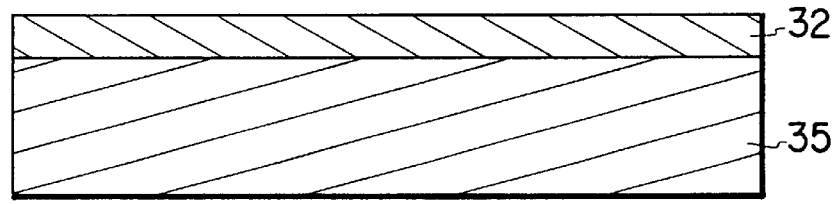

Then as shown in FIG. 3B, the P-type monocrystalline Si substrate 31 is made porous from the backside by anodization by use of an HF solution to form a porous Si layer 33. While the density of monocrystalline Si is 2.33 g/cm$^3$, the density of porous monocrystalline Si layer 33 can be varied from 1.1 to 0.6 g/cm$^3$ by varying the concentration of the HF solution in the range of from 50 to 20%. The porous layer is formed in a P-type substrate as described before. After the porous structure formation in the monocrystalline silicon substrate, a protective film is formed on the side wall of the pores of the porous layer as shown in FIG. 3C. In forming the protective layer, the procedure as described in Embodiment 1 is also employed.

Figure 3D:
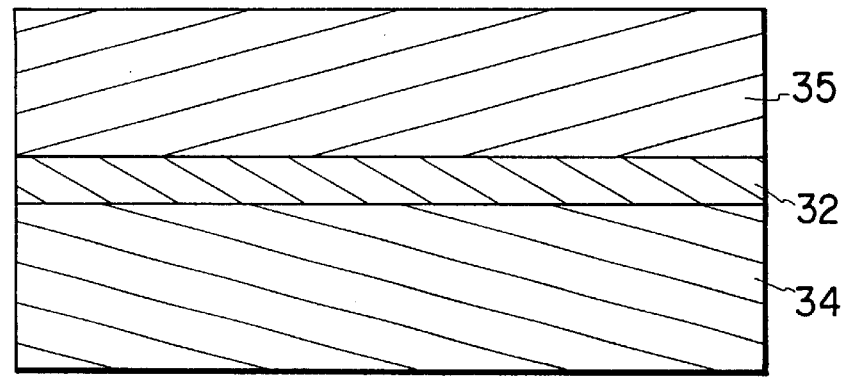

Then as shown in FIG. 3D, a substrate 34 having an insulating layer on the surface is bonded to the surface of the monocrystalline Si layer 32 on the porous Si substrate 35 or to the oxidized surface of the monocrystalline Si layer 32. An oxide layer may be formed on the monocrystalline Si layer on the porous Si layer, and may be bonded to a desired substrate such as an Si substrate.

Figure 3E:
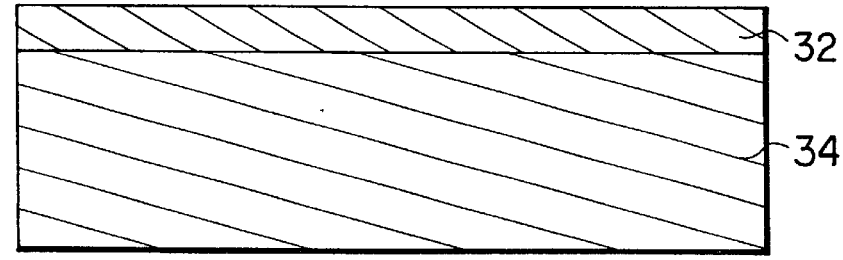

The porous layer 35 of the porous Si substrate is entirely removed by etching to obtain a substrate having an insulting layer thereon and a thin monocrystalline silicon layer remaining thereon as shown in FIG. 3E.

FIG. 3E illustrates a semiconductor substrate obtained according to the present invention, in which a monocrystalline Si layer 32 having crystallinity similar to a silicon wafer is formed in a shape of uniform flat thin layer in a large area on a substrate 34 having an insulating layer on the surface or a light-transmissive substrate 34 over the entire wafer.

The resulting semiconductor substrate can be used suitably for production of dielectrically isolated electronic elements.

In the above embodiment, an N-type layer is formed before the porous structure formation, and subsequently the P-type portion of the substrate only is selectively made porous.

The present invention is described in more detail by reference to specific examples.

EXAMPLE 1

A P-type (100) monocrystalline Si substrate of 200 $\mu$m thick was anodized in a 50% HF solution at a current density of 100 mA/cm$^2$. The porous structure formation rate was 8.4 $\mu$m/min. The entire of the P-type (100) Si substrate of 200 $\mu$m thick was made porous in 24 minutes.

The porous substrate was immersed for 10 minutes in a 5% aqueous hydrogen peroxide solution heated to 80° C. On the resulting P-type (100) porous Si substrate, an Si epitaxial layer was made to grow at a low temperature by an MBE (molecular beam epitaxy) method to a thickness of 0.52 μm. The deposition conditions were as follows:

Temperature: 700° C.
Pressure: $1 \times 10^{-9}$ Torr
Growth rate: 0.1 nm/sec

The surface of this epitaxial layer was thermally oxidized in a thickness of 50 nm. Onto the thermally oxidized layer, was superposed a monocrystalline silicon substrate having a silicon oxide layer of 1 μm thick formed on the surface. The combined substrates were heated at 950° C. for 2 hours in an oxygen atmosphere to bond the two substrates tightly.

The bonded substrates were subjected to selective etching by use of a mixture of a buffered hydrofluoric acid, alcohol, and hydrogen peroxide solution (10:6:50) as the etching solution without stirring. In 175 minutes, the porous Si substrate was selectively etched and removed completely with the monocrystalline Si layer remaining unetched as the etch-stop material.

The rate of etching of the nonporous monocrystalline Si by the etching solution is as low as 40 Å or less for 175 minutes. The selectivity of the etching of the porous layer to the nonporous layer was $10^5$ or more, so that the amount of etching of the nonporous layer (several tens of Å) is practically negligible. After removal of 200 μm thick porous Si substrate and the $Si_3N_4$ layer, there was obtained a monocrystalline Si layer formed in a thickness of 0.5 μm on the surface of the silicon oxide surface on the silicon substrate.

The Si layer was confirmed to have sufficient crystallinity without introduction of new crystal defect according to observation by transmission electron microscopy.

EXAMPLE 2

A P-type (100) monocrystalline Si substrate of 200 μm thick was anodized in a 50% HF solution at a current density of 100 mA/cm². The porous structure formation rate was 8.4 μm/min. The entire of the P-type (100) Si substrate of 200 μm thick was made porous in 24 minutes.

The porous substrate was subjected to heat treatment at 300° C. for 2 hours in an oxygen atmosphere. On the resulting P-type (100) porous Si substrate, an Si epitaxial layer was made to grow at a low temperature by a plasma CVD method in a thickness of 5 μm. The deposition conditions were as follows:

Gas: $SiH_4$
High frequency power: 100 W
Temperature: 800° C.
Pressure: $1 \times 10^{-2}$ Torr
Growth rate: 2.5 nm/sec The surface of this epitaxial layer was thermally oxidized to a thickness of 50 nm. Onto the thermally oxidized layer, was superposed an optically polished fused quarts substrate. The combined substrates were heated at 1000° C. for 2 hours in an oxygen atmosphere to bond the two substrates tightly.

The bonded two substrates were coated with 0.1 μm thick $Si_3N_4$ by plasma CVD. Then the nitride film on the porous substrate only was removed by reactive ion etching.

The bonded substrates were subjected to selective etching by use of a mixture of a buffered hydrofluoric acid, alcohol, and hydrogen peroxide solution (10:6;50) as the etching solution without stirring. In 175 minutes, the porous Si substrate was selectively etched and removed completely with the monocrystalline Si layer remaining unetched as the etch-stop material.

The rate of etching of the nonporous monocrystalline Si by the etching solution is as low as 40 Å or less for 175 minutes. The selectivity of the etching of the porous layer to the nonporous layer was $10^5$ or more, so that the amount of etching of the nonporous layer (several tens of Å) is practically negligible. After removal of the 200 μm thick porous Si substrate and the $Si_3N_4$ layer, there was obtained a monocrystalline Si layer of 5 μm thick on the fused quartz glass substrate.

EXAMPLE 3

A P-type (100) monocrystalline Si substrate of 200 μm thick was anodized in a 50% HF solution at a current density of 100 mA/cm². The porous structure formation rate was 8.4 μm/min. The entire of the P-type (100) Si plate of 200 μm thick was made porous in 24 minutes.

The porous substrate was subjected to heat treatment at 400° C. for one hour in an oxygen atmosphere. Then on the resulting P-type (100) porous Si substrate, an Si epitaxial layer was made to grow by a CVD method in a thickness of 1 μm. The deposition conditions were as follows:

Gas: $SiH_2Cl_2$ (0.6 l/min)
$H_2$ (100 l/min)
Temperature: 950° C.
Pressure: 80 Torr
Growth rate: 0.3 μm/min The surface of this epitaxial layer was thermally oxidized to a thickness of 50 nm. Onto the thermally oxidized layer, was superposed an optically polished glass substrate having a softening point of about 500° C. The combined substrates were heated at 450° C. for 0.5 hour in an oxygen atmosphere to bond the two substrates tightly.

The bonded two substrates were coated with 0.1 μm thick $Si_3N_4$ by plasma CVD. Then the nitride film on the porous substrate only was removed by reactive ion etching.

The bonded substrates were subjected to selective etching by use of a mixture of a buffered hydrofluoric acid, alcohol, and hydrogen peroxide solution (10:6:50) as the etching solution without stirring. In 175 minutes, the porous Si substrate was selectively etched and removed completely with the monocrystalline Si layer remaining unetched as the etch-stop material.

The rate of etching of the nonporous monocrystalline Si by the etching solution is as low as 40 Å or less for 175 minutes. The selectivity of the etching of the porous layer to the nonporous layer was $10^5$ or more, so that the amount of etching of the nonporous layer (several tens of Å) is practically negligible. After removal of the 200 μm thick porous Si substrate and the $Si_3N_4$ layer, there was obtained a monocrystalline Si layer of 1 μm thick on the glass substrate having a low softening point.

In the case where the $Si_3N_4$ layer was replaced by Apiezon Wax coating or Electron Wax coating, the effect was the same, and the porous Si substrate only was removed completely.

EXAMPLE 4

A P-type (100) monocrystalline Si substrate of 200 μm thick was anodized in a 50% HF solution at a current density of 100 mA/cm². The porous structure formation rate was 8.4 μm/min. The entire of the P-type (100) Si plate of 200 μm thick was made porous in 24 minutes.

The porous substrate was subjected to heat treatment at 500° C. for one hour in an atmosphere containing ammonia.

On the resulting P-type (100) porous Si substrate, an Si epitaxial layer was made to grow by a bias sputtering method in a thickness of 1.0 μm. The deposition conditions were as follows:
 RF frequency: 100 MHz
 High frequency power: 600 W
 Temperature: 300° C.
 Ar gas pressure: 8×10$^{-3}$ Torr
 Growth time: 120 min
 Target DC bias: −200 V
 Substrate DC bias: +5 V On the surface of this epitaxial layer, 500 nm thick silicon oxide layer was formed by thermal oxidation. Onto the thermally oxidized layer, was superposed an Si substrate. The combined substrates were heated at 1000° C. for 2 hours in a nitrogen atmosphere to bond the two substrates tightly.

The bonded substrates were subjected to selective etching by use of a mixture of a buffered hydrofluoric acid, alcohol, and hydrogen peroxide solution (10:6:50) as the etching solution without stirring. In 175 minutes, the porous Si substrate was selectively etched and removed completely with the monocrystalline Si layer remaining unetched as the etch-stop material.

The rate of etching of the nonporous monocrystalline Si by the etching solution is as low as 40 Å or less for 175 minutes. The selectivity of the etching of the porous layer to the nonporous layer was 10$^5$ or more, so that the amount of etching of the nonporous layer (several tens of Å) is practically negligible.

By the etching, the porous Si substrate of 200 μm thick was removed, and a monocrystalline Si layer of 0.75 μm thick was formed on the Si substrate with interposition of the oxide layer of 500 nm thick.

EXAMPLE 5

A P-type (100) monocrystalline Si substrate of 600 μm thick was anodized in a 50% HF solution at a current density of 5 mA/cm$^2$. The porous structure formation rate was 1 μm/min. On the surface of the P-type (100) Si substrate of 600 μm thick was formed a porous layer in a thickness of 20 μm.

The porousified substrate was subjected to heat treatment at 300° C. for 2 hours in an oxygen atmosphere. The heat-treated substrate was found to be monocrystalline by an RHEED method. On the P-type (100) porous Si substrate, an epitaxial Si layer was made to grow at a low temperature by a liquid phase growth method in a thickness of 10 μm. The growth conditions were as follows:
 Solvent: Sn
 Growth temperature: 900° C.
 Growth atmosphere: H$_2$
 Growth time: 20 minutes Onto the surface of this epitaxial Si layer, a monocrystalline silicon substrate was superposed which had a silicon oxide layer of 1 μm thick formed on the surface. The combined substrates were heated at 900° C. for 5 hours in an oxygen atmosphere to bond the two substrates tightly.

Then the nonporous portion of the substrate having the porous layer of the bonded substrates was removed by grinding to uncover the porous layer.

The bonded substrates were subjected to selective etching by use of a mixture of a buffered hydrofluoric acid, alcohol, and hydrogen peroxide solution (10:6:50) as the etching solution without stirring. In 20 minutes, the porous Si substrate was selectively etched off completely with the monocrystalline Si layer remaining unetched as the etch-stop material.

The rate of etching of the nonporous monocrystalline Si by the etching solution is as low as 10 Å or less for 20 minutes. The selectivity of the etching of the porous layer to the nonporous layer was 10$^5$ or more, so that the amount of etching of the nonporous layer (several tens of Å) is practically negligible.

By the etching, the 600 μm thick Si substrate having the porous layer was removed, and the monocrystalline Si layer of 10 μm thick was formed on the silicon substrate having an oxide surface layer.

EXAMPLE 6

On a P-type (100) Si substrate of 200 μm thick, an Si epitaxial layer was made to grow to a thickness of 0.5 μm by a CVD method. The deposition conditions were as follows:
 Reactive gas flow rate:
  SiH$_2$Cl$_2$, 1000 SCCM
  H$_2$, 230 l/min
 Temperature: 1080° C.
 Pressure: 80 Torr
 Time: 1 min This substrate was anodized in a 50% HF solution at a current density of 100 mA/cm$^2$. The porous structure formation rate was 8.4 μm/min. The entire of the P-type (100) Si substrate of 200 μm thick was made porous in 24 minutes. In the anodization, the P-type (100) Si substrate only was made porous, and the Si epitaxial layer remained unchanged as described above.

The substrate which had been made porous was immersed in a mixture of 36% hydrochloric acid, 30% aqueous hydrogen peroxide solution and water in the ratio of 1:1:3 at 80° C. for 10 minutes and washed with water.

The surface of the epitaxial layer was thermally oxidized to a thickness of 50 nm. Onto the thermally oxidized layer, was superposed an optically polished fused quarts substrate. The superposed two substrates were heated at 1000° C. for 0.5 hour in an oxygen atmosphere to bond the two substrates tightly.

The bonded two substrates were coated with Si$_3$N$_4$ in a thickness of 0.1 μm by low pressure CVD. Then the nitride film on the porous substrate only was removed by reactive ion etching.

The bonded substrates were subjected to selective etching by use of a mixture of a buffered hydrofluoric acid, alcohol, and hydrogen peroxide solution (10:6:50) as the etching solution without stirring. In 175 minutes, the porous Si substrate was selectively etched off completely with the monocrystalline Si layer remaining unetched as the etch-stop material.

The rate of etching of the nonporous monocrystalline Si by the etching solution is as low as 40 Å or less for 175 minutes. The selectivity of the etching rate of the porous layer to that of the nonporous layer was 10$^5$ or more, so that the amount of etching of the nonporous layer (several tens of Å) is practically negligible. After removal of the 200 μm thick porous Si substrate and the Si$_3$N$_4$ layer, there was obtained the monocrystalline Si layer of 0.5 μm thick on the fused quartz glass substrate.

In the case where the Si$_3$N$_4$ layer was replaced by Apiezon Wax coating or Electron Wax coating, the effect was the same, and the porous Si substrate only was removed completely.

The Si layer was confirmed to have sufficient crystallinity without introduction of new crystal defect according to sectional observation by transmission electron microscopy.

EXAMPLE 7

On the surface of a 200 μm thick P-type (100) Si substrate, an N-type Si layer was formed in a thickness of 1 μm by proton ion implantation. The amount of implanted H$^+$ was $5\times10^{15}$ (ions/cm$^2$).

This substrate was anodized in a 50% HF solution at a current density of 100 mA/cm$^2$. The porous structure formation rate was 8.4 μm/min. The entire of the P-type (100) Si substrate of 200 μm thick was made porous in 24 minutes. In the anodization, the P-type (100) Si substrate only was made porous, and the N-type Si layer remained unchanged, as described above.

The substrate made porous was heat-treated at 300° C. for 2 hours in an oxygen atmosphere.

The surface of the N-type monocrystalline layer was thermally oxidized to a thickness of 50 nm. Onto the thermally oxidized layer, was superposed an optically polished fused quarts substrate. The combined substrates were heated at 800° C. for 0.5 hour in an oxygen atmosphere to bond the two substrates tightly.

The bonded two substrates were coated with $Si_3N_4$ in a thickness of 0.1 μm by low pressure CVD. Then the nitride film on the porous substrate only was removed by reactive ion etching.

The bonded substrates were subjected to selective etching by use of a mixture of a buffered hydrofluoric acid, alcohol, and hydrogen peroxide solution (10:6:50) as the etching solution without stirring. In 175 minutes, the porous Si substrate was selectively etched off completely with the monocrystalline Si layer remaining unetched as the etch-stop material.

The rate of etching of the nonporous monocrystalline Si by the etching solution is as low as 40 Å or less for 175 minutes. The selectivity ratio of the etching rate of the porous layer to that of the nonporous layer was $10^5$ or more, so that the amount of etching of the nonporous layer (several tens of Å) is practically negligible. After removal of the 200 μm thick porous Si substrate and the $Si_3N_4$ layer, there was obtained a monocrystalline Si layer of 1.0 μm thick on the glass substrate.

In the case where the $Si_3N_4$ layer was replaced by Apiezon Wax coating or Electron Wax coating, the effect was the same, and the porous Si substrate only was removed completely.

The Si layer was confirmed to have sufficient crystallinity without introduction of new crystal defect according to sectional observation by transmission electron microscopy.

As described above, the present invention provides a semiconductor substrate and a process for producing the semiconductor substrate which are free from the disadvantages of prior art and satisfy the requirements for the prior art.

The present invention also provides a process for producing a semiconductor substrate having an Si crystalline layer of crystallinity as high as that of a monocrystalline wafer, on a substrate having an insulating layer on the surface or a light-transmissive insulating substrate typified by glass, with prominence in productivity, uniformity, controllability, and cost.

The present invention further provides to provide a semiconductor substrate which has the advantage of the conventional SOI structure and is applicable to various high-performance electronic devices, and to provide a process for production thereof.

The present invention further provides a semiconductor substrate which is useful in place of expensive SOS and SIMOX in production of large scale integrated circuits of SOI structure, and to a process for production thereof.

In the present invention, by using a monocrystalline silicon substrate having originally high quality as a starting material, a surface monocrystalline layer is transferred onto a light-transmissive insulating substrate, and rest of the substrate is chemically removed, whereby a number of treatments are practicable in a short time and brings about great improvements in productivity and cost as described above.

What is claimed is:

1. A composite member comprising a first substrate and a second substrate bonded to each other; the first substrate having a porous silicon layer provided on the second substrate side thereof, the porous silicon layer having a protective film on a side surface of the pores, a non-porous monocrystalline silicon layer provided between the porous silicon layer and the second substrate, and an insulating layer arranged between the non-porous monocrystalline silicon layer and the second substrate.

2. The composite member according to claim 1, wherein the first substrate is a monocrystalline silicon substrate.

3. The composite member according to claim 1, wherein the second substrate is a monocrystalline silicon substrate.

4. The composite member according to claim 1, wherein the protective film is a silicon oxide film.

5. The composite member according to claim 1, wherein the protective film is an oxide film formed by oxidizing a part of the porous silicon layer.

6. The composite member according to claim 1, wherein the protective film has a thickness of 1 nm to 40 nm.

7. The composite member according to claim 1, wherein the insulating layer is a silicon oxide film.

* * * * *

UNITED STATES PATENT AND TRADEMARK OFFICE
CERTIFICATE OF CORRECTION

PATENT NO. : 6,468,663 B1
DATED : October 22, 2002
INVENTOR(S) : Nobuhiko Sato et al.

It is certified that error appears in the above-identified patent and that said Letters Patent is hereby corrected as shown below:

<u>Title page,</u>
Item [56], OTHER PUBLICATIONS, "le;.3qMaterials" should read -- Materials --; and "Materials Letters" should read -- Materials Letters --.

<u>Column 3,</u>
Line 49, "provides" should read -- provide --.

<u>Column 9,</u>
Line 57, "quarts" should read -- quartz --.

<u>Column 12,</u>
Line 33, "quarts" should read -- quartz --.

Signed and Sealed this

First Day of July, 2003

JAMES E. ROGAN
*Director of the United States Patent and Trademark Office*